United States Patent [19]

Nakayama

[11] Patent Number: 5,787,456
[45] Date of Patent: Jul. 28, 1998

[54] SEMICONDUCTOR MEMORY DEVICE WHICH CAN PERFORM A HIGH SPEED OPERATION

[75] Inventor: Hiroshi Nakayama, Tokyo, Japan

[73] Assignee: NEC Corporation, Tokyo, Japan

[21] Appl. No.: 688,271

[22] Filed: Jul. 29, 1996

[30] Foreign Application Priority Data

Jul. 28, 1995 [JP] Japan .................................. 7-193690

[51] Int. Cl.⁶ ............................ G06F 12/00; G06F 13/00
[52] U.S. Cl. ........................ 711/100; 711/105; 711/181; 365/154
[58] Field of Search ...................... 395/432, 481; 711/100, 105, 181; 365/154, 205, 208

[56] References Cited

PUBLICATIONS

NEC Technical Journal, vol. 47, No. 3 (Serial 301) Apr. 1994, pp. 74–83.

*Primary Examiner*—Tod R. Swann
*Assistant Examiner*—Tuan V. Thai
*Attorney, Agent, or Firm*—Young & Thompson

[57] ABSTRACT

A semiconductor memory device includes a memory cell array, a data latch signal generator and a data latch circuit latching data read from the memory cell array in response to a latch signal from the data latch signal generator. The data latch signal generator includes a F/F which is set in response to a CAS signal and reset in response to a RAS signal, and a delay element which delays a signal from the F/F to generate the data latch signal.

13 Claims, 3 Drawing Sheets

SEMICONDUCTOR MEMORY DEVICE WHICH CAN PERFORM A HIGH SPEED OPERATION

BACKGROUND OF THE INVENTION

1. Field of the Invention

The present invention relates to a semiconductor memory device, and more particularly to a semiconductor memory device such as a dynamic random access memory (DRAM) performing a high speed operation such as a hyperpage operation.

2. Description of Related Art

A hyperpage operation is generally known as a high speed operation of a semiconductor memory device. According to the hyperpage operation, a column address strobe (CAS) signal is successively activated several times while a row address strobe (RAS) signal is activated, and data which are selected by a row address signal and a column address signal are successively read out to an output terminal of the semiconductor memory device. In the hyperpage operation, an effective period of data outputting on the output terminal is extended to a beginning of a next data outputting.

According to the hyperpage operation, since the effective period of data outputting is extended, an operation of a next read cycle can be started before an operation of a previous read cycle is terminated, so that a read cycle time can be shortened.

In a conventional semiconductor memory device performing a hyperpage operation, however, it is possible that incorrect data is output when the read cycle time is shortened. Therefore, a semiconductor memory device performing the hyperpage operation which prevents incorrect data output would be desirable.

SUMMARY OF THE INVENTION

It is therefore an object of the present invention to provide a semiconductor memory device which can perform a high speed operation.

It is another object of the present invention to provide a semiconductor memory device preventing incorrect data output even though a read cycle time is shortened.

A semiconductor memory device according to the present invention has a memory cell array, a data latch signal generator and a data latch circuit. The data latch signal generator has a first circuit portion generating an internal signal in response to a CAS signal and a RAS signal and a second circuit portion including a delay element which delays the internal signal to generate a data latch signal. The data latch circuit has a data input node coupled to the memory cell array, a clock node supplied with said data latch signal, and an output node.

Thus, since the data latch circuit latches data from the memory cell array in response to the data latch signal which is the delay signal of the CAS signal, a time margin by the delay element is assured. Therefore, according to the present invention, a semiconductor memory device which prevents incorrect data being latched is obtained even if the read cycle time is shortened.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
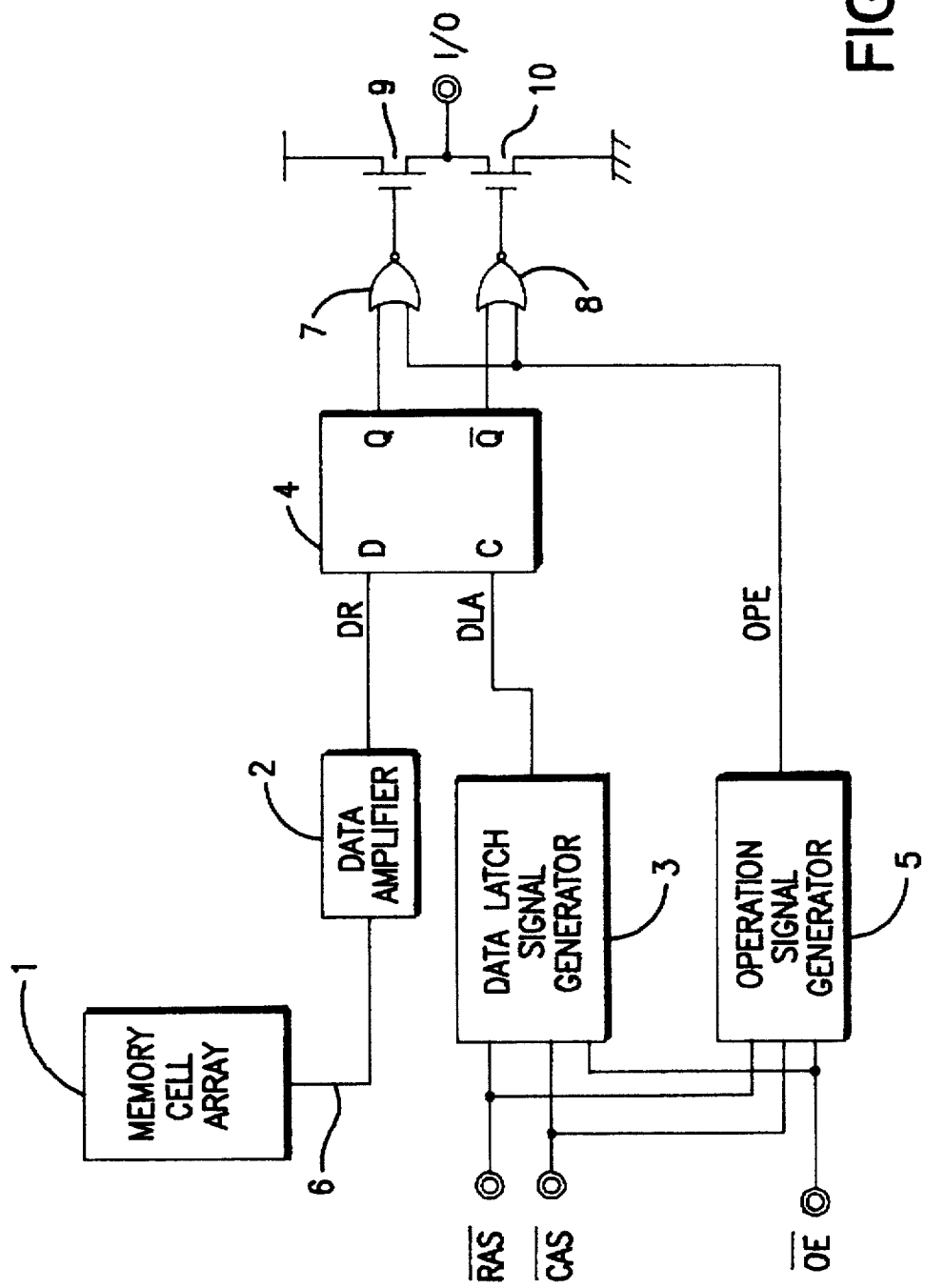
FIG. 1 is a block diagram indicating a semiconductor memory device according to an embodiment of the present invention.

Referring to FIG. 1, a semiconductor memory device according to an embodiment of the present invention has a memory cell array 1, a data amplifier 2, a data latch signal generator 3, a flip-flop (F/F) 4, an operation signal generator 5, NOR gates 7 and 8, and output transistors 9 and 10. Data which is read from the memory cell array 1 is supplied to the data amplifier 2 through a line 6, so that the data amplifier 2 supplies an amplified signal to a data input node D of the F/F 4 through a data line DR.

Each of the data latch signal generator 3 and the operation signal generator 5 is supplied with a row address strobe (RAS) signal, a column address strobe (CAS) signal and an output enable (OE) signal. The data latch signal generator 3 and the operation signal generator 5 generate a data latch signal DLA and an operation signal OPE, respectively, in response to these signals supplied thereto.

The data latch signal DLA generated by the data latch signal generator 3 is supplied to a clock node C of the F/F 4, and the operation signal OPE generated by the operation signal generator 5 is supplied to one input of the NOR gates 7 and 8, as shown in FIG. 1. The other input of the NOR gates 7 and 8 are respectively connected to an output and an inverted output of the F/F 4. Outputs of the NOR gates 7 and 8 are respectively connected to gate electrodes of the output transistors 9 and 10.

Thus, when the operation signal OPE takes low level, an I/O pin shown in FIG. 1 is connected to either a power line or a ground line because one of the output transistors 9 and 10 is in ON state and the other is in OFF state responsive to data latched into the F/F 4. That is, data having either a high level or low level is output to the I/O pin responsive to the data latched into the F/F 4, as an output signal. On the contrary, when the operation signal OPE takes high level, the I/O pin is not connected to either of the power and ground lines, because both of the output transistors 9 and 10 are in OFF state regardless of the data latched into the F/F 4. Therefore, the I/O pin takes high impedance state.

Figure 2:
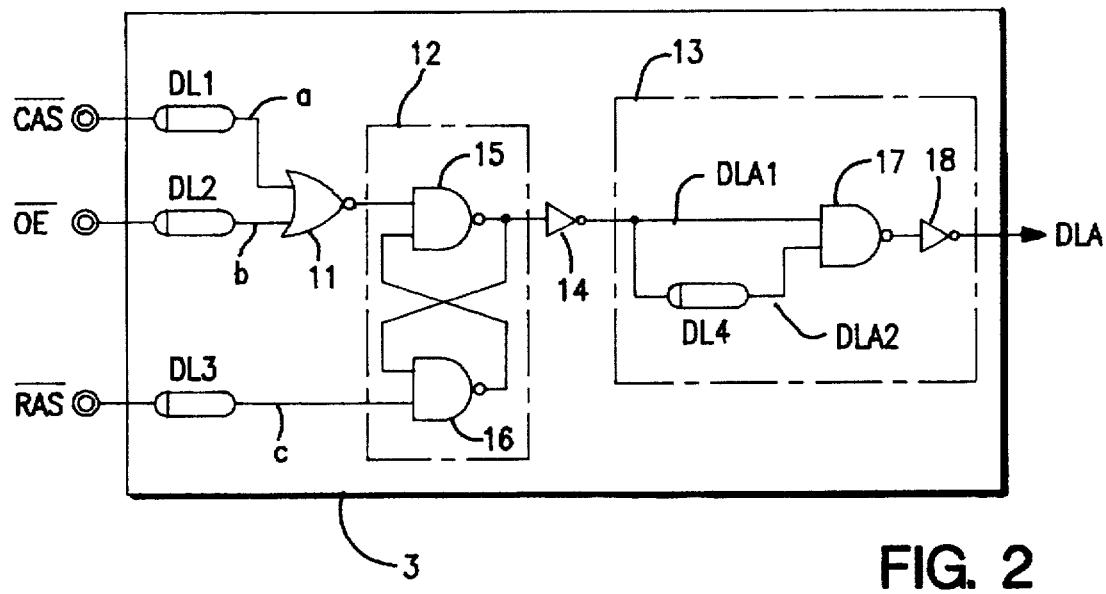
FIG. 2 is a circuit diagram of the data latch signal generator shown in FIG. 1.

Referring now to FIG. 2, the data latch signal generator 3 has delay elements DL1–DL3, a NOR gate 11, a R-S F/F 12, a latch timing controller 13 and an invertor 14. The R-S F/F 12 includes two NAND gates 15 and 16, and the latch timing controller 13 includes a delay element DL4, a NAND gate 17 and an invertor 18.

Figure 3:
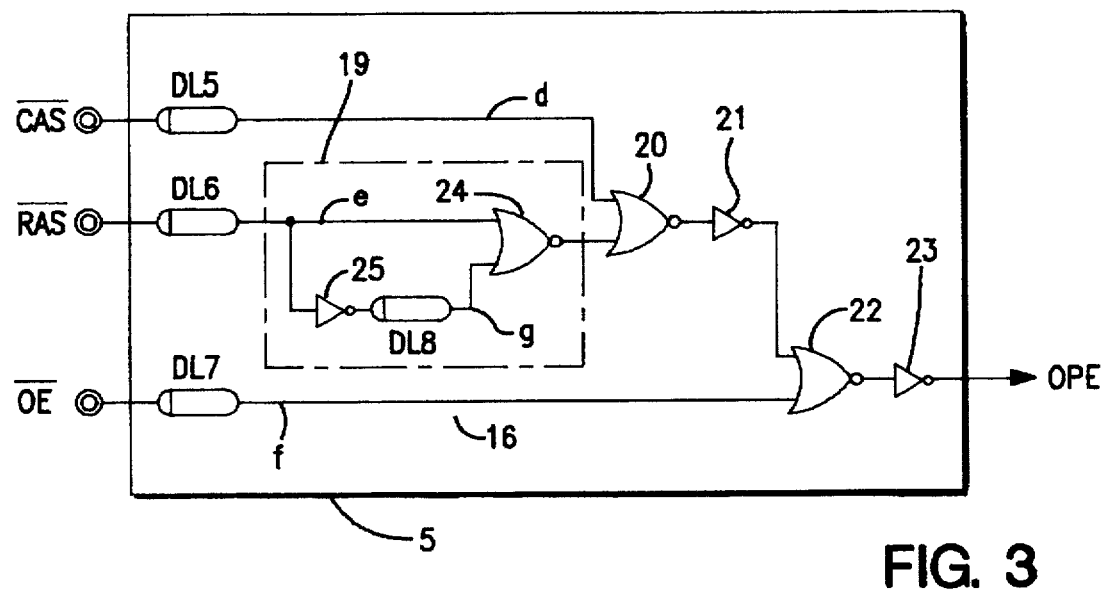
FIG. 3 is a circuit diagram of the operation signal generator shown in FIG. 1.

Referring to FIG. 3, the operation signal generator 5 has delay elements DL5–DL7, a hyper-controller 19, NOR gates 20 and 22 and invertors 21 and 23. The hyper-controller 19 includes a delay element DL8, a NOR gate 24 and an invertor 25.

Next, the operation of the semiconductor memory device according to this embodiment will be explained with reference to FIG. 4.

At first, the RAS signal, the CAS signal and the OE signal are all high level (inactive level), so that the data latch signal DLA is low level and the operation signal OPE is high level. Therefore, the I/O pin has a high impedance state at that time.

Thereafter, the RAS signal is changed to low level (active level) to start a read cycle. However, each of the delay elements DL3 and DL5 supplied with the RAS signal has a relatively long delay time compared with other delay elements DL1 and DL6 supplied with the CAS signal or DL2 and DL7 supplied with the OE signal, so that delay signals (c) and (d) of the RAS signal do not change immediately, as shown in FIG. 4. Thereafter, the OE signal and the CAS signal are changed to low level (active level) in this order, so that delay signals (b) and (f) of the OE signal and delay signals (a) and (e) of the CAS signal also change with relatively short delay.

Figure 4:
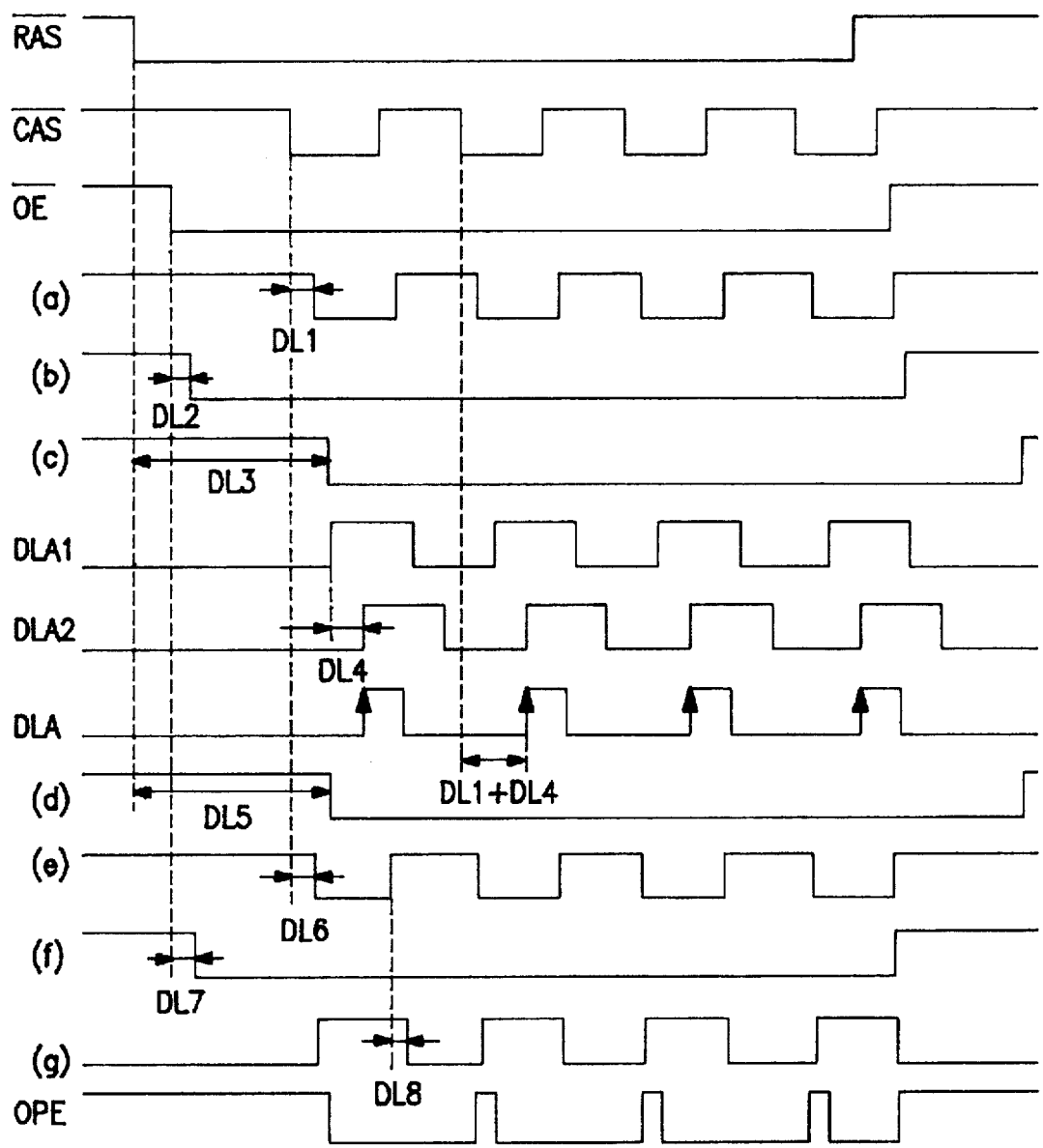
FIG. 4 is a timing chart showing the operation of the FIG. 1 embodiment.

As shown in FIG. 4, the delay signal (c) of the RAS signal changes to low level after the delay signal (a) changes to low level, and the delay signal (d) of the RAS signal changes to low level after the delay signal (e) changes to low level. In response to the delay signal (c) changing to low level, the R-S F/F 12 (FIG. 2) of the data latch signal generator 3 is reset to supply a signal of low level to the invertor 14, so that an internal signal DLA1 changes to high level. Thus, a delay signal DLA2, which is delayed by the delay element DL4, also changes to high level after a delay time of the delay element DL4. Thus, the data latch signal DLA changes from low level to high level so that data on the data line DR is latched into the F/F 4 in response to the rising edge of the signal DLA.

On the other hand, in response to the delay signal (d) changing to low level, all of inputs of the NOR gates 20 and 22 (FIG. 3) are supplied with input signals of low level, so that the operation signal OPE changes to low level. Therefore, data which corresponds to the data latched into the F/F 4 in response to the rising edge of the data latch signal DLA is enabled to output to the I/O pin.

Thereafter, the delay signal (a) changes to high level again in response to the CAS signal changing to high level. In response to the delay signal (a) changing to high level, the R-S F/F 12 is set to supply a signal of high level to the invertor 14, so that the data latch signal DLA changes to low level again.

When the CAS signal is activated again, i.e., the CAS signal is changed to low level again to start a next read cycle, the delay signal (a) also changes to low level and the R-S F/F 12 is reset again, so that the internal signal DLA1 changes to high level. After the delay by the delay element DL4, the data latch signal DLA changes to high level again to latch a new data on the data line DR.

On the other hand, in response to the delay signal (e) of the CAS signal changing to low level, both inputs of the NOR gate 24 (FIG. 3) are supplied with input signals of low-level until the delay signal (g) changes to high level, so that the operation signal OPE changes to high level as a one shot pulse. Therefore, the I/O pin takes high impedance state while data latched into the F/F 4 is changed in response to the rising edge of the data latch signal DLA.

According to this embodiment of the present invention, it is noted that the timing of the second rising edge (also third or subsequent rising edges) of the data latch signal DLA depends on not only the delay element DL1 but also the delay element DL4. That is, read data is latched into the F/F 4 after the CAS signal of the active state is delayed by the delay elements DL1 and DL4. Therefore, even though the delay time of the delay element DL1 is restricted by a specification of the memory device, a time margin equal to the delay by the delay elements DL1 and DL4 is assured.

Therefore, according to the present invention, the semiconductor memory device performing a high speed operation, which prevents an incorrect data being latched to output is obtained even if the read cycle time is shortened.

It is apparent that the present invention is not limited to the above embodiment but may be changed and modified without departing from the scope and spirit of the invention.

What is claimed is:

1. A semiconductor memory device, comprising:
   a memory cell array;
   an output terminal;
   a data latch signal generator having a first circuit portion and a second circuit portion,
   said first circuit portion generating an internal signal in response to a column address strobe (CAS) signal and a row address strobe (RAS) signal, wherein said first circuit portion of said data latch signal generator comprises a R-S F/F circuit having a reset input and an output, said set input of said R-S F/F being supplied with said CAS signal, said reset input of said R-S F/F being supplied with said RAS signal, said output of said R-S F/F supplying said internal signal;
   said second circuit portion including a first delay element which delays said internal signal to generate a data latch signal;
   a data latch circuit having a data input, a clock input and an output, said data input of said data latch circuit being coupled to said memory cell array, said clock of said data latch circuit being supplied with said data latch signal, said data latch circuit latching a data on said data input in response to said data latch signal on said clock; and
   an output circuit having an input and an output, said input of said output circuit being coupled to said output of said data latch circuit, said output of said output circuit being coupled to said output terminal to supply an output signal.

2. The semiconductor memory device as claimed in claim 1, wherein said second circuit portion of said data latch signal generator further includes an AND gate, one input of said AND gate being supplied with said internal signal, and another input of said AND gate being coupled to said first delay element, an output of said AND gate supplying said data latch signal.

3. The semiconductor memory device as claimed in claim 1, wherein said first circuit portion of said data latch signal generator comprises a second delay element supplied with said CAS signal to generate a first delay signal, a third delay element supplied with said RAS signal to generate a second delay signal and a R-S F/F circuit having a set input supplied with said first delay signal, a reset input supplied with said second delay signal and an output supplying said internal signal.

4. The semiconductor memory device as claimed in claim 3, wherein said second circuit portion of said data latch signal generator further includes an AND gate, one input of said AND gate being supplied with said internal signal, and another input of said AND gate being coupled to said first delay element, an output of said AND gate supplying said data latch signal.

5. The semiconductor memory device as claimed in claim 1, further comprising an operation signal generator generating an operation signal in response to said RAS signal and said CAS signal, said output circuit being enabled to output said output signal to said output terminal in response to said operation signal.

6. The semiconductor memory device as claimed in claim 5, wherein said operation signal generator comprises a first gate circuit supplied with said CAS signal to generate a first signal responsive to activation of said CAS signal, a second gate circuit having a first input node supplied with said RAS signal, a second input node supplied with said first signal and output node supplying said operation signal.

7. A semiconductor memory device, comprising:

a memory cell array;

an output terminal;

a data latch signal generator including a first gate circuit, a F/F circuit, a first delay element, a second gate circuit and a data latch signal output;

said first gate circuit of said data latch signal generator having a first input node supplied with a column address strobe (CAS) signal, a second input node supplied with an output enable (OE) signal and an output;

said F/F circuit of said data latch signal generator having a first input coupled to said output of said first gate circuit, a second input supplied with a row address strobe (RAS) signal and an output;

said first delay element of said data latch signal generator having an input coupled to said output of said F/F circuit, and an output;

said second gate circuit of said data latch signal generator having a first input coupled to said output of said F/F circuit, a second input coupled to said output of said first delay element and an output coupled to said data latch signal output;

a data latch circuit having a data input coupled to said memory cell array, a clock input coupled to said data latch signal output of said data latch signal generator, and a data output;

an operation signal generator including a second delay element, a third gate circuit, a fourth gate circuit and an operation signal output;

said second delay element of said operation signal generator having an input supplied with said CAS signal, and an output;

said third gate circuit of said operation signal generator having a first input supplied with said CAS signal, a second input coupled to said output of said second delay element, and an output;

said fourth gate circuit of said operation signal generator having a first input supplied with said RAS signal, a second input supplied with said OE signal, a third input coupled to said output of said third gate circuit and an output coupled to said operation signal output; and an output circuit having a data input coupled to said data output of said data latch circuit, an enable coupled to said operation signal output, and an output coupled to said output terminal.

8. A semiconductor memory device, comprising:

a memory cell array;

a data amplifier amplifying data read from said memory cell array to generate amplified data;

a data latch signal generator including a first circuit supplied with a column address strobe (CAS) signal and a row address strobe (RAS) signal and a second circuit, said first circuit generating an internal signal synchronized with said CAS signal when said RAS signal is activated, wherein said first circuit of said data latch signal generator comprises a R-S Flip Flop (F/F) circuit having a set input, a reset input and an output, said set input of said R-S F/F being supplied with said RAS signal, said output of said R-S F/F supplying said internal signal; said second circuit having a first delay element supplied with said internal signal to generate a first delay signal and a first gate circuit, said first gate circuit having a first input supplied with said internal signal, a second input supplied with said first delay signal, and an output supplying a data latch signal; and a data latch circuit latching said amplified data in response to said data latch signal.

9. The semiconductor memory device as claimed in claim 8, wherein said first circuit of said data latch signal generator comprises a delay block supplied with said CAS signal to generate a second delay signal, a second delay element supplied with said RAS signal to generate a third delay signal, a F/F circuit having a first input supplied with said second delay signal, a second input supplied with said third delay signal and an output supplying said internal signal.

10. The semiconductor memory device as claimed in claim 9, wherein said delay block comprises a third delay element supplied with said CAS signal to generate a fourth delay signal, a fourth delay element supplied with an OE signal to generate a fifth delay signal and a second gate circuit having a first input supplied with said fourth delay signal, a second input supplied with said fifth delay signal, and an output supplying said second delay signal.

11. The semiconductor memory device as claimed in claim 10, wherein said F/F circuit further comprises a third gate circuit, a fourth gate circuit and an invertor, said third gate circuit having a first input supplied with said second delay signal, a second input and an output, said fourth gate circuit having a first input supplied with said third delay signal, a second input coupled to said output of said third gate circuit, and an output coupled to said second input of said third gate circuit, said invertor having an input coupled to said output of said third gate circuit and an output supplying said internal signal.

12. The semiconductor memory device as claimed in claim 10, wherein said second gate circuit is a NOR gate.

13. The semiconductor memory device as claimed in claim 8, wherein said first gate circuit is an AND gate.

* * * * *